United States Patent
Song et al.

(10) Patent No.: US 8,410,683 B2
(45) Date of Patent: Apr. 2, 2013

(54) ORGANIC LIGHT EMITTING DIODE DISPLAY AND METHOD FOR MANUFACTURING THE SAME

(75) Inventors: Jung-Bae Song, Seongnam-si (KR);
Un-Cheol Sung, Anyang-si (KR);
Sung-Hun Lee, Seoul (KR);
Beohm-Rock Choi, Seoul (KR);
Jung-Soo Rhee, Hwaseong-si (KR);
Sang-Woo Lee, Hwaseong-si (KR);
Ji-Hye Choi, Suwon-si (KR);
Jung-Yeon Kim, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 317 days.

(21) Appl. No.: 12/505,880

(22) Filed: Jul. 20, 2009

(65) Prior Publication Data
US 2010/0133994 A1   Jun. 3, 2010

(30) Foreign Application Priority Data
Dec. 2, 2008   (KR) ................. 10-2008-0121460

(51) Int. Cl.
*H01J 1/62* (2006.01)
(52) U.S. Cl. .................... 313/504; 362/84
(58) Field of Classification Search ......... 313/502–505; 362/84
See application file for complete search history.

(56) References Cited

U.S. PATENT DOCUMENTS

| | | | | |
|---|---|---|---|---|
| 2005/0249972 A1* | 11/2005 | Hatwar et al. | | 428/690 |
| 2006/0083943 A1* | 4/2006 | Maxted et al. | | 428/690 |
| 2006/0105201 A1* | 5/2006 | Lee et al. | | 428/690 |
| 2007/0075310 A1* | 4/2007 | Lee | | 257/40 |
| 2007/0102737 A1 | 5/2007 | Kashiwabara et al. | | |
| 2008/0224600 A1* | 9/2008 | Im et al. | | 313/504 |
| 2008/0258609 A1* | 10/2008 | Nakamura | | 313/504 |

FOREIGN PATENT DOCUMENTS

| | | |
|---|---|---|
| JP | 2005-174639 | 6/2005 |
| JP | 2006-005012 | 1/2006 |
| JP | 2006-196237 | 7/2006 |
| JP | 2006-302506 A | 11/2006 |
| JP | 2007-234241 A | 9/2007 |
| JP | 2007-299729 A | 11/2007 |
| JP | 2007533157 | 11/2007 |
| KR | 100497094 B | 6/2005 |
| KR | 1020060079225 A | 7/2006 |
| KR | 100635056 | 10/2006 |
| KR | 100712096 B | 4/2007 |
| KR | 100754127 B | 8/2007 |
| KR | 100778818 B | 11/2007 |
| KR | 1020080005642 A | 1/2008 |

\* cited by examiner

*Primary Examiner* — Joseph L Williams
*Assistant Examiner* — Brenitra M Lee
(74) *Attorney, Agent, or Firm* — F. Chau & Associates, LLC

(57) ABSTRACT

An organic light emitting device and a manufacturing method thereof is provided. The organic light emitting device includes a first pixel that displays a first color, a second pixel that displays a second color, and a third pixel that displays a third color. The first pixel, the second pixel and the third pixel together form one pixel. Each of the first pixel, second pixel, and third pixel includes a pixel electrode having a transflective electrode, an organic emission layer on the pixel electrode that displays the first color, a common electrode on the third color organic emission layer, and a transparent supplementary member between the pixel electrode and the common electrode.

13 Claims, 10 Drawing Sheets

ORGANIC LIGHT EMITTING DIODE DISPLAY AND METHOD FOR MANUFACTURING THE SAME

CROSS-REFERENCE TO RELATED APPLICATION

This application claims priority to and the benefit of Korean Patent Application No. 10-2008-0121460 filed in the Korean Intellectual Property Office on Dec. 2, 2008, the entire contents of which are incorporated herein by reference.

BACKGROUND OF THE INVENTION (a) Field of the Invention

The present disclosure relates to an organic light emitting device and a manufacturing method thereof.

(b) Discussion of the Related Art

An organic light emitting device includes two electrodes and an organic light emitting layer interposed between the two electrodes. One of the two electrodes injects holes and the other injects electrons into the light emitting layer. The injected electrons and holes are combined to form excitons and the excitons emit light as discharge energy. The organic light emitting device is a self-emissive type that does not require a light source, and, as such, has good power consumption, response speed, viewing angle, and contrast ratio.

An organic light emitting device typically includes a plurality of pixels such as a red pixel, a blue pixel, a green pixel, and a white pixel, and displays full colors by combining the colors thereof. Each pixel includes an organic light emitting element and a plurality of thin film transistors for driving them.

An organic light emitting element includes an anode and a cathode as its two electrodes, and has an organic light emitting member as an emission layer therebetween. The organic light emitting member emits light of three primary colors such as red, green, and blue, or of white. The organic light emitting member may be made by using a shadow mask. Here, the shadow mask includes a plurality of openings having substantially the same size and shape as the organic light emitting members. An organic material is deposited through the openings such that a plurality of organic light emitting members may be formed at one time.

SUMMARY OF THE INVENTION

An organic light emitting device according to an exemplary embodiment of the present invention includes a first pixel that displays a first color, a second pixel that displays a second color, and a third pixel that displays a third color, the first pixel, second pixel and third pixel together forming one pixel group. Each of the first pixel, second pixel, and third pixel includes a pixel electrode having a transflective electrode, an organic emission layer on the pixel electrode that displays the first color and a common electrode on the organic emission layer. A transparent supplementary member is between the pixel electrode and the common electrode.

An organic light emitting device according to an exemplary embodiment of the present invention includes a first pixel that displays a first color, a second pixel that displays a second color, and a third pixel that displays a third color, the first pixel, second pixel and third pixel together forming one pixel group. Each of the first pixel, second pixel, and third pixel includes a pixel electrode having a transflective electrode, a third color organic emission layer on the pixel electrode that displays the third color, and a common electrode on the third color organic emission layer. The first pixel further includes a first transparent supplementary member and a first color organic emission layer that displays the first color, the first transparent supplementary member and the first color organic emission layer being between the pixel electrode and the common electrode. The second pixel further includes a second color organic emission layer between the pixel electrode and the common electrode that displays the second color.

A second transparent supplementary member may be further included between the pixel electrode and the common electrode of the third pixel.

The first transparent supplementary member and second transparent supplementary member may be of a material such as ITO or IZO.

The first transparent supplementary member may contact the pixel electrode of the first pixel, and the second transparent supplementary member may contact the pixel electrode of the third pixel.

The first pixel further may include the second color organic emission layer, and the second pixel may further include the first color organic emission layer.

In the one pixel group, the first color organic emission layers of the first pixel and the second pixel may be connected to each other. The second color organic emission layers of the first pixel and second pixel may be connected to each other. The first color organic emission layer and second color organic emission layer may overlap each other.

The first color organic emission layer and second color organic emission layer may be under the third color organic emission layer.

At least one of a hole mobility of the first color organic emission layer and a hole mobility of the second color organic emission layer may be less than a hole mobility of the third color organic emission layer.

At least one of a host of the first color organic emission layer and a host of the second color organic emission layer may include at least one of a hole transmitting material such as triphenylamine, a carbazole derivative, or a metallic complex.

At least one of a host of the first color organic emission layer and a host of the second color organic emission layer may include at least one of NPB (N,N-di(naphthalene-1-yl)-N,N-diphenyl-benzidene), TPB (tetraphenylbenzidine), CBP (4,4'-N,N'-dicarbazolebiphenyl), mCP (N,N-dicarbazolyl-3,5-benzene), TcTa (4,4',4"-tri(N-carbazolyl)triphenylamine), ZnPBO (phenyloxazole), or ZnPBT (phenylthiazole).

An organic light emitting device according to an exemplary embodiment of the present invention includes a first pixel that displays a first color, a second pixel that displays a second color, and a third pixel that displays a third color, the first pixel, second pixel and third pixel together forming one pixel group. Each of the first pixel, second pixel, and third pixel includes a pixel electrode having a transflective electrode, a third color organic emission layer on the pixel electrode that displays the third color, and a common electrode on the third color organic emission layer. The first pixel may further include a first color organic emission layer that displays the first color and a second color organic emission layer that displays the second color, the first color organic emission layer and the second color organic emission layer being between the pixel electrode and the common electrode. The second pixel may further include the second color organic emission layer between the pixel electrode and the common electrode.

In the one pixel group, the second color organic emission layers of the first pixel and second pixel may be connected to each other, and the second color organic emission layer may be on the first color organic emission layer.

The first color organic emission layer and second color organic emission layer may be under the third color organic emission layer.

A hole mobility of the first color organic emission layer may be less than a hole mobility of the second color organic emission layer and a hole mobility of the third color organic emission layer.

A hole mobility of the first color organic emission layer may be less than $1 \times 10^{-4}$ cm$^2$/Vs (when an electric field is 1 MV/cm).

The first color may be red. The second color may be green. The third color may blue.

The transflective electrode may include a metal such as Ag or Al.

The pixel electrode may further include a conductive oxide member on or under the transflective electrode.

The conductive oxide member may a material such as ITO or IZO.

DETAILED DESCRIPTION OF THE EMBODIMENTS

Figure 1:
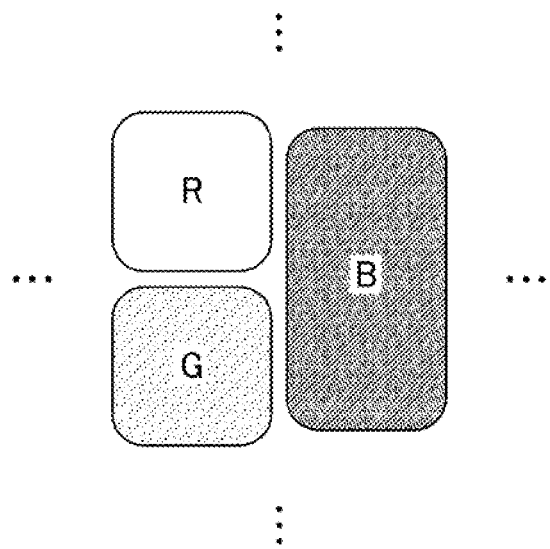
FIG. 1 is a top plan view schematically showing the arrangement of one of a plurality of pixels in an organic light emitting device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

Referring now to FIG. 1, an organic light emitting device according to an exemplary embodiment of the present invention includes a red pixel R for displaying a red color, a green pixel G for displaying a green color, and a blue pixel B for displaying a blue color. The red color, the green color, and the blue color is one example of basic colors to display full colors, and red pixels R, green pixels G, and blue pixels B may be basic pixels to display full colors. In the present exemplary embodiment, three pixels form one group of pixels and the groups of pixels are repeatedly arranged according to a row and column.

In more detail regarding the arrangement of the red pixels R, green pixels G, and blue pixels B, the red pixels R and the green pixels G alternate with each other in columns, and the blue pixels B are consecutively arranged in columns adjacent to the columns having the alternating red and green pixels. Also, the pair of the red pixels R and green pixels G that alternate with each other in the column direction alternate with the blue pixel B in the row direction.

The areas of the red pixels R and the green pixels G are substantially the same, and the area of the blue pixel B may be larger than each area of the red pixels R and the green pixels G. The blue pixels B are larger than the red pixels R and the green pixels G such that a balance of the luminances of the red pixel R, green pixel G, and blue pixel B may be controlled even when the emitting efficiency and lifetime of the blue emission layer are deteriorated.

In this way, the shape and arrangement of the pixels may be variously changed, and a different pixel such as a white pixel displaying a white color may be further included.

Next, one pixel of an organic light emitting device according to an exemplary embodiment of the present invention will be described with reference to FIGS. 1 and 2.

Figure 2:
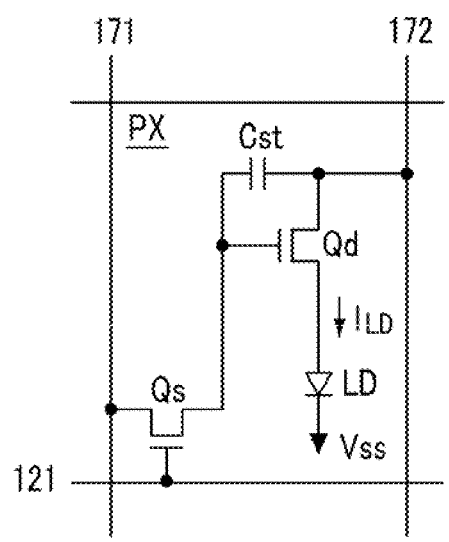
FIG. 2 is an equivalent circuit diagram of one pixel in an organic light emitting device according to an exemplary embodiment of the present invention.

FIG. 2 is an equivalent circuit diagram of one pixel in an organic light emitting device according to an exemplary embodiment of the present invention. The organic light emitting device includes a plurality of signal lines 121, 171, 172, and a pixel PX connected thereto. The pixel PX may be one of the red pixel R, green pixel G, and blue pixel B shown in FIG. 1.

The signal lines include a plurality of gate signal lines 121 for transmitting gate signals (or scanning signals), a plurality of data lines 171 for transmitting data signals, and a plurality of driving voltage lines 172 for transmitting a driving voltage. The gate lines 121 extend in a row direction and are substantially parallel to each other. The data lines 171 extend in a column direction and are substantially parallel to each other. The driving voltage lines 172 extend in a column direction and are substantially parallel to each other. However, they may extend in the row direction or the column direction, or may form a mesh shape.

One pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD as an organic light emitting diode (OLED) has an anode connected to the output terminal of the driving transistor Qd and a cathode connected to a common voltage Vss. The organic light emitting element LD emits light having an intensity depending on an output current ILD of the driving transistor Qd, thereby displaying images. The organic light emitting element LD may include an organic material uniquely emitting at least one of three primary colors of red, green, and blue, and the organic light emitting device displays desired images by a spatial sum thereof.

The switching transistor Qs and the driving transistor Qd are n-channel field effect transistors (FETs). However, at least one thereof may be a pchannel FET. As would be appreciated by ones skilled in the art, the connection relationships among the transistors Qs, Qd, capacitor Cst, and organic light emitting diode LD may be modified.

Next, a cross-sectional structure of an organic light emitting device according to an exemplary embodiment of the present invention will be described with reference to FIGS. 3 and 4, as well as FIG. 2.

Figure 3:
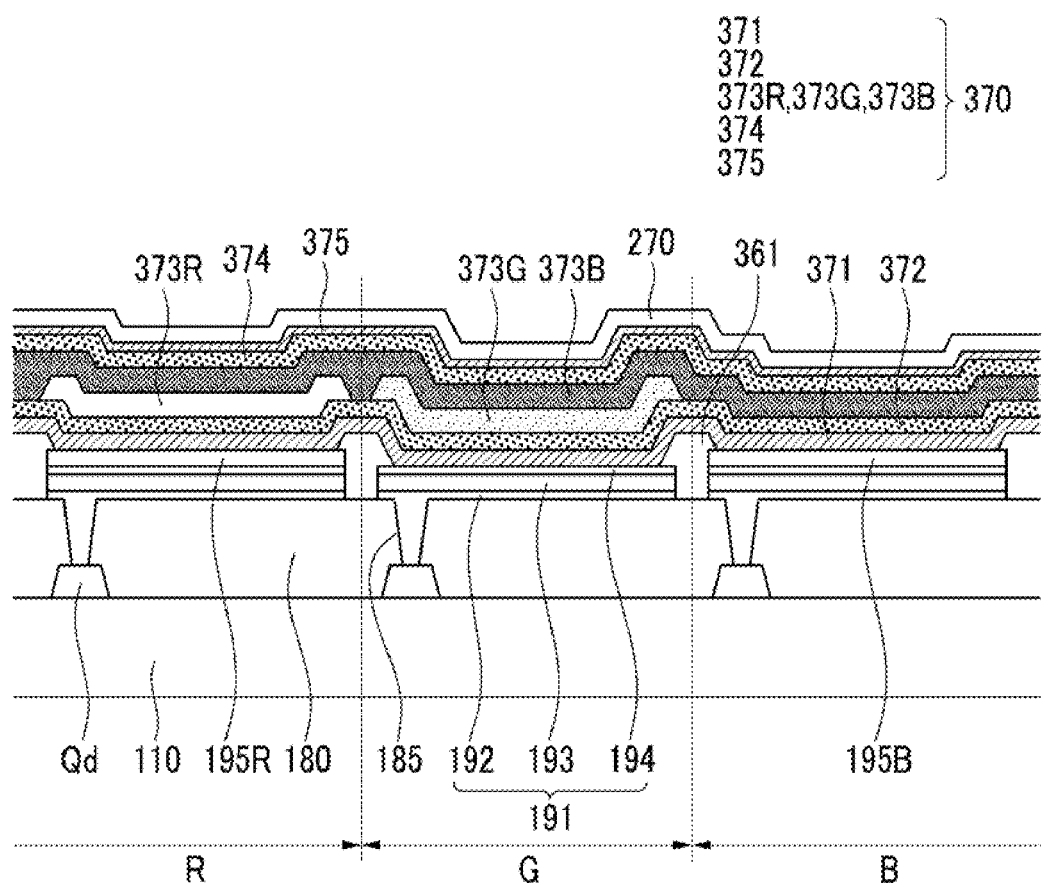
FIGS. 3, 4, 7, and 9 are cross-sectional views of three pixels in an organic light emitting device according to an exemplary embodiment of the present invention.
Figure 4:
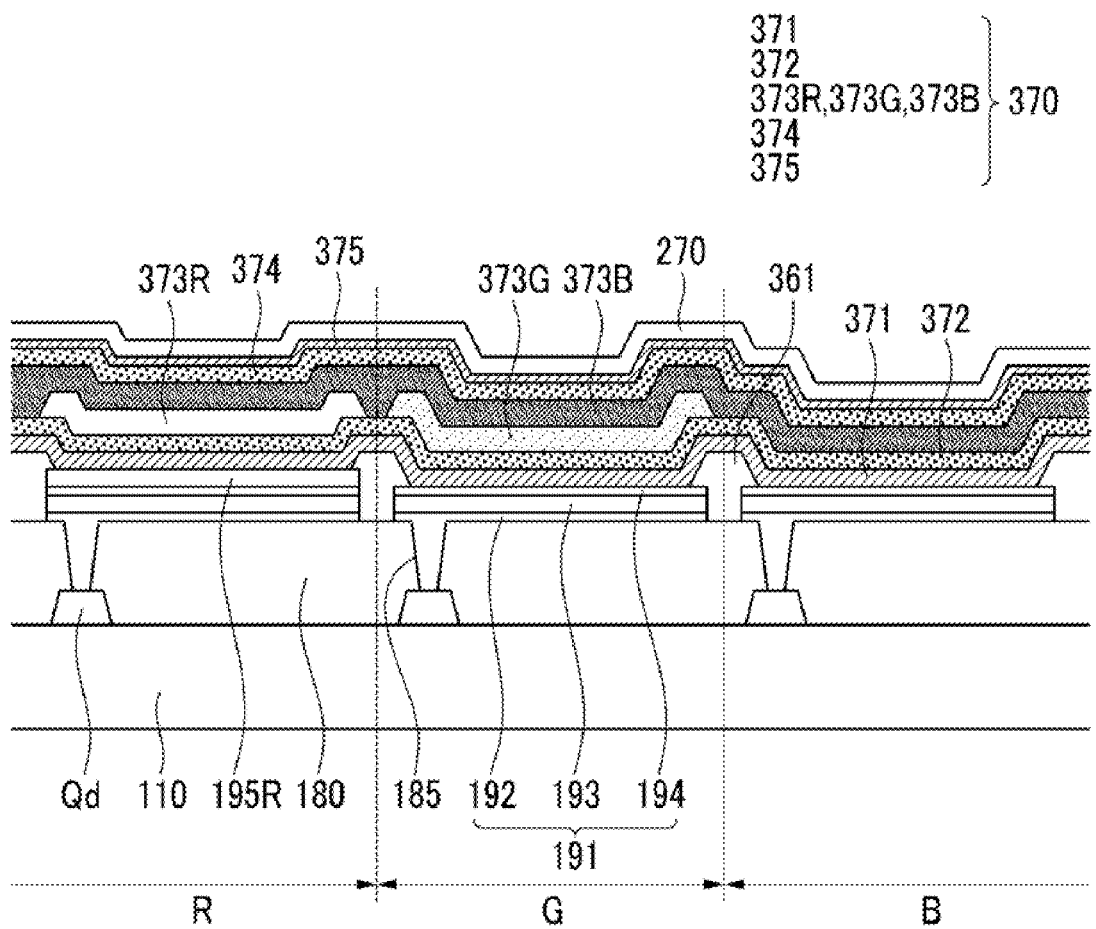

FIGS. 3 and 4 are cross-sectional views of three pixels in an organic light emitting device according to an exemplary embodiment of the present invention.

A plurality of driving transistors Qd are formed on an insulation substrate 110 made of transparent glass, plastic or the like. Also, a plurality of signal lines (not shown) and a plurality of switching transistors (not shown) may be further formed on the insulation substrate 110.

A passivation layer 180 made of an inorganic material or an organic material is formed on the driving transistors Qd. When the passivation layer 180 is made of the organic material, the surface thereof may be flat.

The passivation layer 180 has contact holes 185 exposing the driving transistors Qd.

A pixel electrode 191 including a lower conductive oxide member 192, a transflective electrode 193, and an upper conductive oxide member 194 is formed on the passivation layer 180 of each of the pixels R, G, B.

The lower conductive oxide member 192 and the upper conductive oxide member 194 may be made of a transparent conductive oxide such as indium tin oxide (ITO) or indium zinc oxide (IZO). The lower and upper conductive oxide members 192, 194 improve adhesion between the transflective electrode 193 and another layer and prevent corrosion therebetween. Particularly, the lower conductive oxide member 192 protects the transflective electrode 193 from oxygen or moisture that may outflow from the passivation layer 180. The lower conductive oxide member 192 or the upper conductive oxide member 194 may be omitted.

The transflective electrode 193 is between the lower conductive oxide member 192 and the upper conductive oxide member 194. The transflective electrode 193 may be made of a metal having high reflectance such as silver (Ag), aluminum (Al), or alloys thereof, and the thickness thereof may be in a range of about 50 Å-250 Å. Even when the metal is used, if it is thin enough, the metal may have transflective characteristics so that light may be both reflected at and transmitted through the metal film.

A transparent supplementary member 195R is on the pixel electrode 191 of the red pixel R. In the embodiment shown in FIG. 3, a transparent supplementary member 195B is further formed on the pixel electrode 191 of the blue pixel B. In FIG. 3, the transparent supplementary member 195R of the red pixel R and transparent supplementary member 195B of the blue pixel B may have the same thickness. The transparent supplementary members 195R, 195B may be made of a transparent conductive material such as ITO or IZO, and the upper conductive oxide member 194 of the red pixel R or the blue pixel B may be omitted in this case.

A plurality of insulating members 361 are between the pixel electrodes 191 for insulation, and may be omitted.

A hole injection layer 371 and a hole transport layer 372 are sequentially deposited on the pixel electrode 191 (or supplementary members 195R, 195B) and the insulating member 361 of the red pixel R, green pixel C, and blue pixel B.

A red organic emission layer 373R is deposited on the hole transport layer 372 of the red pixel R, and a green organic emission layer 373G is deposited on the hole transport layer 372 of the green pixel G. Also, a blue organic emission layer 373B is formed on the whole surface of the red organic emission layer 373R and green organic emission layer 373G and the hole transport layer 372. The red organic emission layer 373R, green organic emission layer 373G, and blue organic emission layer 373B may be made of organic materials, each uniquely emitting light of red, green, and blue.

To prevent color mixture, an organic light emitting material for the red organic emission layer 373R or green organic emission layer 373G may have a hole mobility of hosts that is less than a hole mobility of hosts an organic light emitting material for the blue organic emission layer 373B, so that the electrons and holes may be combined to emit light in the red organic emission layer 373R of the red pixel R or in the green organic emission layer 373C of the green pixel G. The thickness of the organic emission layers 373R, 373G, 373B may be appropriately controlled. The red organic emission layer 373R and green organic emission layer 373G may be made of a hole transmitting material of a triphenylamine group such as NPB (N,N-di(naphthalene-1-yl)-N,N-diphenyl-benzidene) and TPB (tetraphenylbenzidine), a carbazole derivative such as CBP (4,4'-N,N'-dicarbazole-biphenyl), mCP (N,N-dicarbazolyl-3,5-benzene), and TcTa (4,4',4"-tri(N-carbazolyl) triphenylamine), and a metallic complex such as ZnPBO (phenyloxazole) and ZnPBT (phenylthiazole).

An electron transport layer 374 and an electron injection layer 375 are sequentially formed on the whole surface of the organic emission layer 373R, 373G, 373B of the red, green, and blue pixels R, G, B.

The hole injection layer 371, the hole transport layer 372, the electron transport layer 374, and the electron injection layer 375 are for increasing the emission efficiency of the organic emission layers 373R, 373C, 373B. The hole transport layer 372 and the electron transport layer 374 are for balancing of the electrons and holes. The hole injection layer 371 and the electron injection layer 375 are for enhancement of the injection of the electrons and holes.

The hole injection layer 371, the hole transport layer 372, the organic emission layer 373R, 373C, 373B, the electron transport layer 374, and the electron injection layer 375 together form an organic light emitting member 370.

A common electrode 270 transmitting a common voltage Vss is formed on the electron injection layer 375. The common electrode 270 may be made of a reflective metal such as Ca, Ba, Mg, Al, or Ag. Also, the common electrode 270 may be multilayered including an upper layer made of a material such as Ca, Al, or Ag, and a lower layer made of a material such as alloys thereof or Mg alloy. In this case, the resistance of the upper layer may be lower than the resistance of the lower layer, and the work function of the lower layer may be relatively low and the injection rate may be relatively high.

An encapsulation layer (not shown) may be formed on the common electrode 270. The encapsulation layer encapsulates the organic light emitting member 370 and the common electrode 270, thereby preventing penetration of moisture and/or oxygen from the outside.

In the organic light emitting device, a pixel electrode 191 (the transparent supplementary members 195R, 195B), a light emitting member 370, and the common electrode 270 form an organic light emitting diode LD. The pixel electrode 191 may receive a voltage from the driving transistor Qd through the contact hole 185 of the passivation layer 180.

However, when the transparent supplementary members 195R, 195B are made of the conductive material, the transparent supplementary members 195R, 195B may be directly connected to the driving transistor Qd.

The organic light emitting device emits light in the lower direction with respect to the substrate 110 to display images. Light emitted from the organic light emitting member 370 toward the substrate 110 passes through the transparent supplementary member 195R, 195B (corresponding to the red pixel R and the blue pixel B in the case of FIG. 3, and corresponding to the red pixel R in the case of FIG. 4), and arrives at the transflective electrode 193. The transflective electrode 193 reflects incident light toward the common electrode 270, and the common electrode 270 reflects light toward the transflective electrode 193. Accordingly, light reciprocating between the transflective electrode 193 and the common electrode 270 is subject to an optical process such as interference, and passes through the transflective electrode 193 to the outside. The reciprocating and interference processes are referred to as a microcavity process.

Here, the optical path length depends on the thicknesses and refractive indices of thin films between the transflective electrode 193 and the common electrode 270 such that light of a wavelength range corresponding to each of the primary colors may be enhanced by appropriately selecting the thickness and materials of the thin films.

In the case of FIG. 3, the optical path length in the red pixel R between the transflective electrode 193 and the common electrode 270 is determined by the thickness and the refractive index of the transparent supplementary member 195R, the hole injection layer 371, the hole transport layer 372, the red organic emission layer 373R, the blue organic emission layer 373B, the electron transport layer 374, and the electron injection layer 375. The optical path length in the green pixel G between the transflective electrode 193 and the common electrode 270 is determined by the thickness and the refractive index of the hole injection layer 371, the hole transport layer 372, the green organic emission layer 373G, the blue organic emission layer 373B, the electron transport layer 374, and the electron injection layer 375. The optical path length in the blue pixel B between the transflective electrode 193 and the common electrode 270 is determined by is determined by the thickness and the refractive index of the transparent supplementary member 195B, the hole injection layer 371, the hole transport layer 372, the blue organic emission layer 373B, the electron transport layer 374, and the electron injection layer 375. Accordingly, the thickness and refractive indices of the layers between the transflective electrode 193 and the common electrode 270 such as the blue organic emission layer 373B and the transparent supplementary member 195B may be selected to enhance the intensity of light corresponding to the blue wavelength. The thickness and the refractive indices of the red organic emission layer 373R and the transparent supplementary member 195R of the red pixel R may be selected to enhance the intensity of light corresponding to the red wavelength considering the thickness of the blue organic emission layer 373B. The thickness and the refractive index of the green organic emission layer 373G may be selected to enhance the intensity of light corresponding to the green wavelength considering the thickness of the blue organic emission layer 373B. Here, the thickness of the transparent supplementary member 195R, 195B of the red and blue pixels R and B may be the same.

As shown in FIG. 4, the transparent supplementary member 195B of the blue pixel B may be omitted, and in this case, the thickness and the refractive indices of the layers between the transflective electrode 193 and the common electrode 270 such as the blue organic emission layer 373B may be selected to enhance the intensity of light corresponding to the blue wavelength in the blue pixel B. According to an exemplary embodiment of the present invention, the optical path length between the transflective electrode 193 and the common electrode 270 may decrease in the sequence of the red pixel R, the green pixel G, and the blue pixel B. That is, the red pixel R includes the transparent supplementary member 195R, the hole injection layer 371, the hole transport layer 372, the red organic emission layer 373R, the blue organic emission layer 373B, the electron transport layer 374, and the electron injection layer 375 such that the optical path length between the transflective electrode 193 and the common electrode 270 is the longest. The green pixel G includes the hole injection layer 371, the hole transport layer 372, the green organic emission layer 373G, the blue organic emission layer 373B, the electron transport layer 374, and the electron injection layer 375 such that the optical path length may be shorter than that of the red pixel R. The blue pixel B includes the transparent supplementary member 195B, the hole injection layer 371, the hole transport layer 372, the blue organic emission layer 373B, the electron transport layer 374, and the electron injection layer 375, such that the optical path length may be shorter than that of the red pixel R. Like the case of FIG. 4, when the transparent supplementary member 195B of the blue pixel B is omitted, the optical path length between the transflective electrode 193 and the common electrode 270 of the blue pixel B may be the shortest of the three pixels R, G, B.

In this way, if the characteristics such as the thickness and the refractive indices of the various layers forming the organic light emitting member 370 and the transparent supplementary member 195R, 195B are appropriately selected, desired optical characteristics, such as a desired range of wavelengths and color purity for each of the primary colors of red, green, and blue, may be obtained, the optical efficiency of an organic light emitting device may be increased and the color reproducibility thereof may be improved.

According to an exemplary embodiment of the present invention that is different from the present exemplary embodiment, the organic light emitting device may emit light in the lower direction with respect to the substrate 110 to display the images. In this case, the transflective electrode 193 may be made of a reflective metal such as Al, Ag, Au, Pt, Ni, Cu, W, or alloys thereof for reflecting light. Also, the common electrode 270 is made of metal such as silver or aluminum, or alloys thereof, having the transflective characteristic allowing the reflection and transmission of light. Also, in a case when an organic light emitting device according to an exemplary embodiment of the present invention includes pixels PX displaying different primary colors besides the red, the green, and the blue, the organic emission layer may be made of an organic material emitting the different primary colors besides the red, the green, and the blue.

Next, a manufacturing method of the organic light emitting device shown in FIGS. 3 and 4 will be described with reference to FIGS. 5 and 6 as well as FIGS. 1 to 4.

Figure 5:
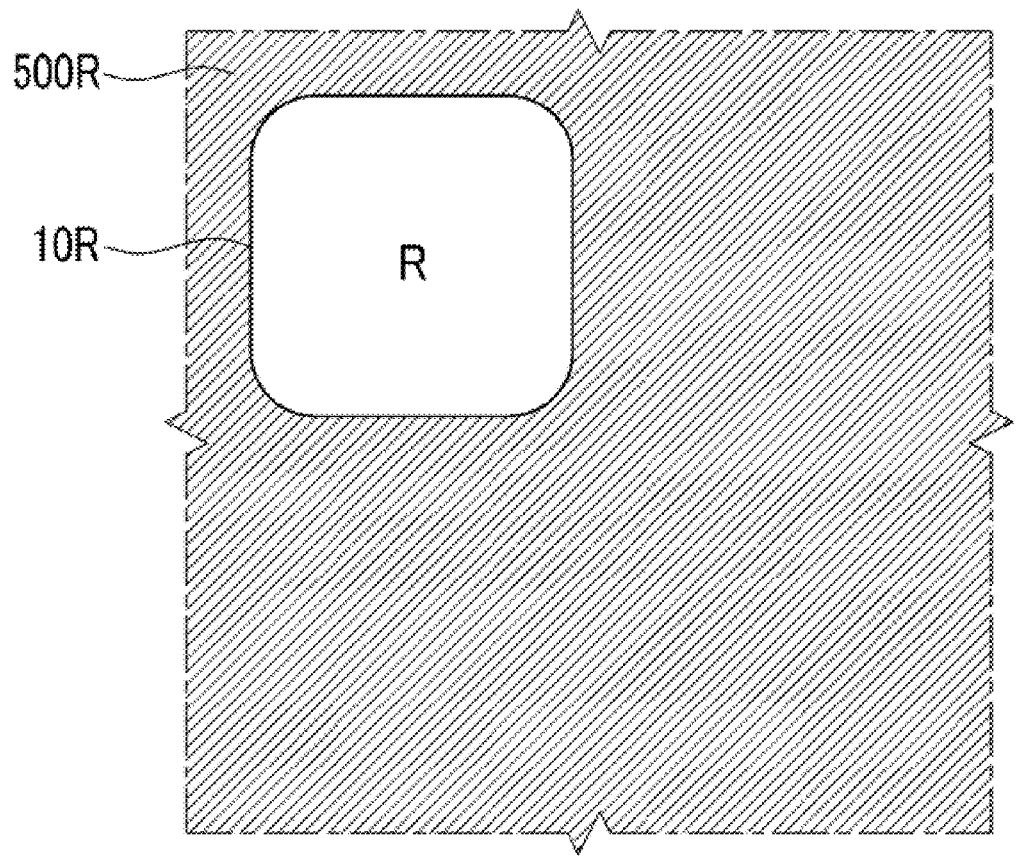
FIGS. 5, 6, 8, 10, and 11 are views showing shadow masks used for forming an organic emission layer in a manufacturing method of an organic light emitting device according to an exemplary embodiment of the present invention.
Figure 6:
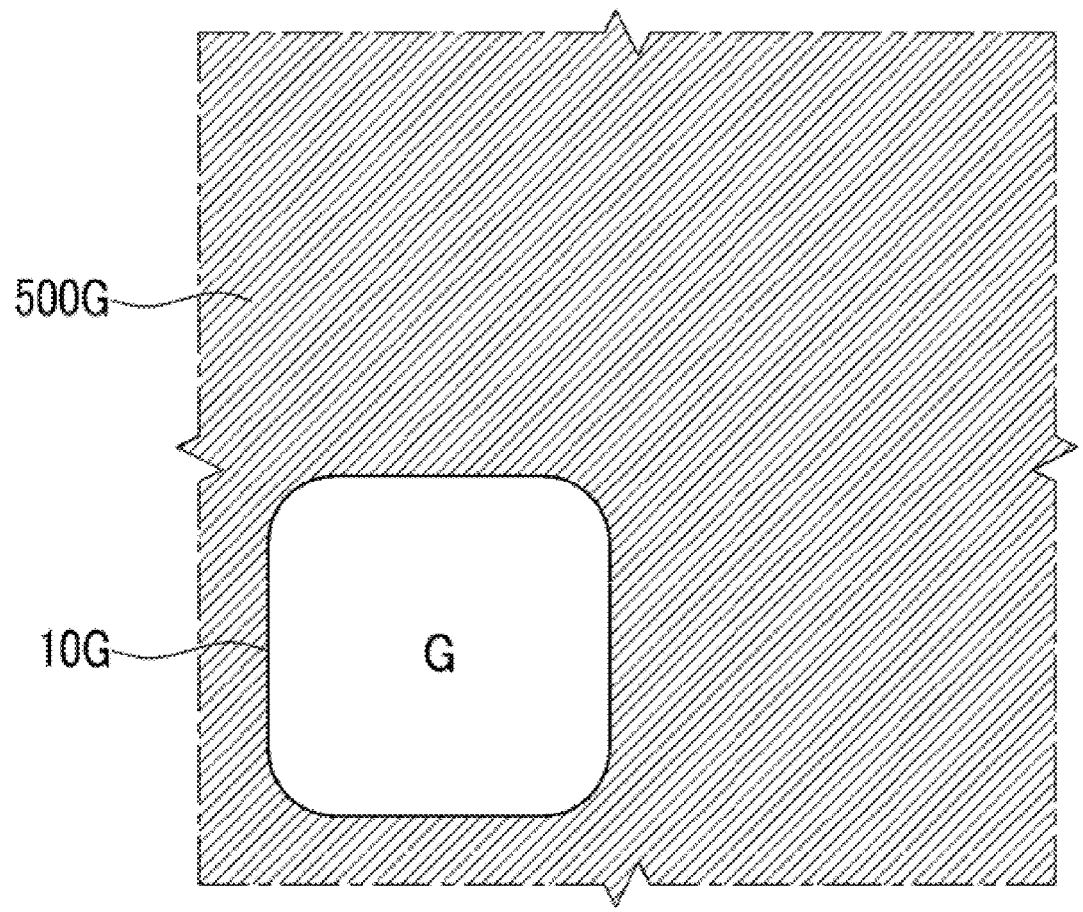

FIGS. 5 and 6 are views showing shadow masks used for forming red and green organic emission layers in a manufacturing method of an organic light emitting device according to an exemplary embodiment of the present invention.

First, referring to FIGS. 3 and 4, a plurality of driving transistors Qd are formed on an insulation substrate 110, and a passivation layer 180 having a plurality of contact holes 185 is formed thereon.

Next, a lower conductive oxide member 192, a transflective electrode 193, and an upper conductive oxide member 194 are deposited on the passivation layer 180 of the pixels R, G, B to form a pixel electrode 191.

Next, in the case of FIG. 3, transparent supplementary members 195R, 195B of ITO or IZO are formed on the upper conductive oxide member 194 of the red pixel R and the blue pixel B, and in the case of FIG. 4, a transparent supplementary member 195R is formed on the red pixel R.

Next, a plurality of insulating members 361 are formed between the pixel electrodes 191, and a hole injection layer 371 and a hole transport layer 372 made of an organic material are formed on the pixel electrode 191 or the transparent supplementary members 195R, 195B.

Next, a red organic emission layer 373R, a green organic emission layer 373G, and a blue organic emission layer 373B are deposited on the hole transport layer 372.

The red organic emission layer 373R is deposited using a first shadow mask 500R shown in FIG. 5. The first shadow mask 500R has an opening 10R having a substantially square shape and corresponding to the red pixel R of the organic light emitting device shown in FIGS. 1 to 4. The first shadow mask 500R is on the substrate 110, and a red organic emission material is deposited through the opening 10R to form a red organic emission layer 373R.

On the other hand, a green organic emission layer 373G is deposited by using a second shadow mask 500G shown in FIG. 6. The second shadow mask 500G has an opening 10G having a substantially square shape and corresponding to the green pixel G of the organic light emitting device shown in FIGS. 1 to 4. A green organic emission material is deposited through the opening 10G to form a green organic emission layer 373G.

Next, a blue organic emission material is deposited on the whole surface of the red organic emission layer 373R, the green organic emission layer 373G, and the hole transport layer 372 to form a blue organic emission layer 373B. The blue organic emission layer 373B is deposited on the whole surface such that no shadow mask is necessary.

In this way, no shadow mask is used when forming the blue organic emission layer 373B such that the manufacturing process and time may be reduced, and the product inferiority rate according to usage of the shadow mask may be reduced.

Next, an organic light emitting device and a manufacturing method thereof according to an exemplary embodiment of the present invention will be described with reference to FIGS. 7 and 8 as well as FIGS. 1 and 2.

Figure 7:
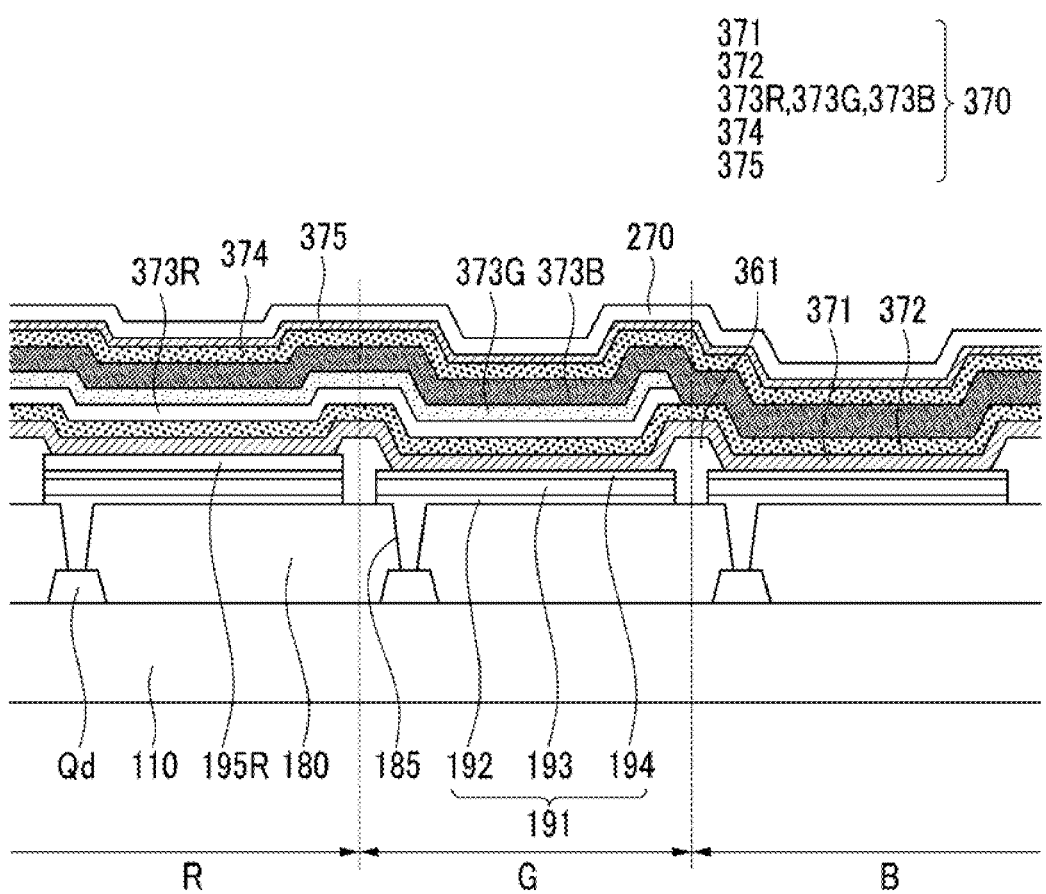
Figure 8:
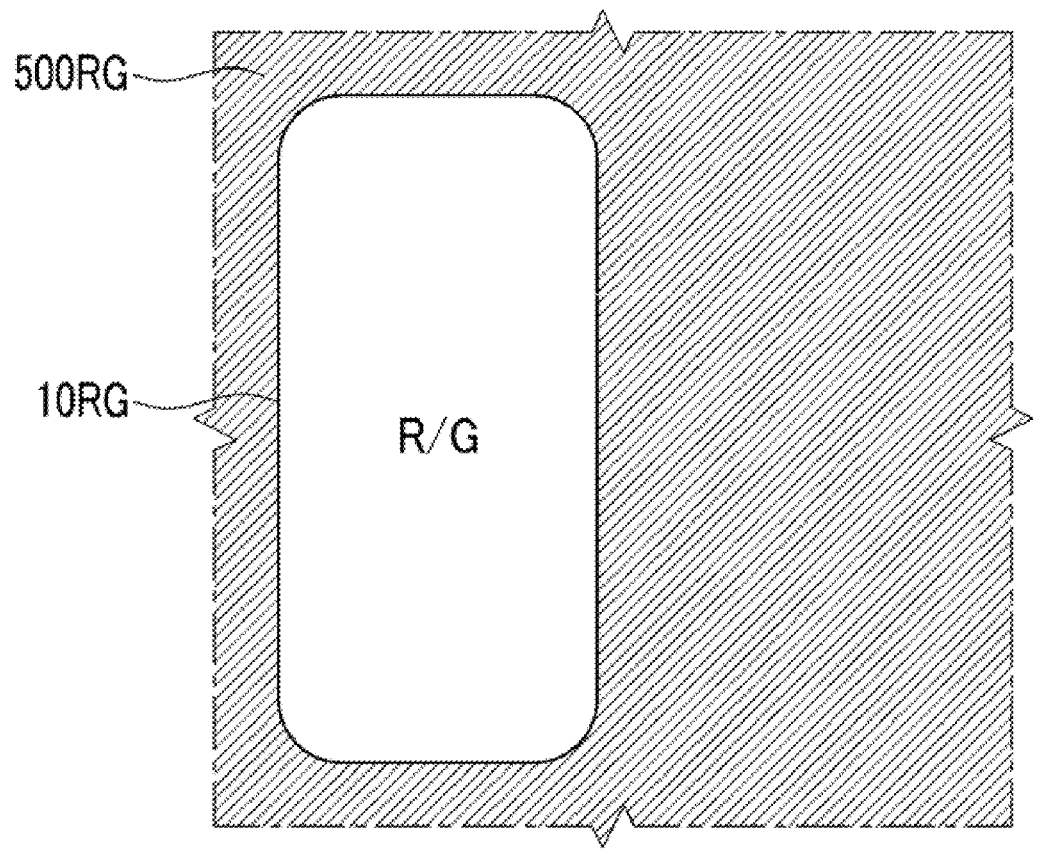

FIG. 7 is a cross-sectional view of three pixels of an organic light emitting device according to an exemplary embodiment of the present invention, and FIG. 8 is a view showing shadow masks used for forming red and green organic emission layers in a manufacturing method of an organic light emitting device according to an exemplary embodiment of the present invention.

An organic light emitting device according to the present exemplary embodiment may be applied with the various characteristics related to the above-described FIGS. 1 and 2.

Referring to FIG. 7, an organic light emitting device according to the present exemplary embodiment is substantially the same as the organic light emitting device shown in FIG. 4, except for the structure of the organic emission layers 373R, 373G, 373B. In the present exemplary embodiment, the red organic emission layer 373R and the green organic emission layer 373G are sequentially deposited commonly in the red pixel R and the green pixel G, and a blue organic emission layer 373B is deposited in all pixels R, G, B.

The thickness and refractive index of the several layers such as the organic emission layers 373R, 373G, 373B between the transflective electrode 193 and the common electrode 270 determine the optical path length between the transflective electrode 193 and the common electrode 270 in the pixels R, G, B. That is, the optical path length in the red pixel R between the transflective electrode 193 and the common electrode 270 is determined by the thickness and the refractive index of the transparent supplementary member 195R, the hole injection layer 371, the hole transport layer 372, the red organic emission layer 373R, the green organic emission layer 373G, the blue organic emission layer 373B, the electron transport layer 374, and the electron injection layer 375. The optical path length in the green pixel G between the transflective electrode 193 and the common electrode 270 is determined by the thickness and the refractive index of the hole injection layer 371, the hole transport layer 372, the red organic emission layer 373R, the green organic emission layer 373G, the blue organic emission layer 373B, the electron transport layer 374, and the electron injection layer 375. The optical path length in the blue pixel B between the transflective electrode 193 and the common electrode 270 is determined by the thickness and the refractive index of the hole injection layer 371, the hole transport layer 372, the blue organic emission layer 373B, the electron transport layer 374, and the electron injection layer 375. The optical path length between the transflective electrode 193 and the common electrode 270 may be selected in the pixels R, G, B for light of the wavelength corresponding to the primary colors to be enhanced through the microcavity process. Particularly, the deposition structures of the organic light emitting member 370 of the red pixel R and the green pixel G are the same in the present exemplary embodiment such that light of the wavelengths corresponding to red and green may be simultaneously enhanced by appropriately selecting the thickness and the refractive index of the transparent supplementary member 195R that is only formed in the red pixel R.

A manufacturing method of the organic light emitting device shown in FIG. 7 is also substantially the same as the manufacturing method of the organic light emitting device according to the previous exemplary embodiment. However, in the present exemplary embodiment, the red organic emission layer 373R and green organic emission layer 373C are deposited using one third shadow mask 500RG shown in FIG. 8. The third shadow mask 500RG has an opening 10RG with a substantially rectangular shape elongated up and down, that is, a shape in which the red pixel R and the green pixel G that are neighboring up and down are connected to each other in the organic light emitting device shown in FIG. 1, and the red organic emission layer 373R and the green organic emission layer 373G are sequentially deposited through the opening 10RG. The blue organic emission layer 373B is deposited on the whole surface such that any shadow mask is not necessary. Accordingly, the number of shadow masks used may be further reduced.

Next, an organic light emitting device and a manufacturing method according to another exemplary embodiment of the present invention will be described with reference to FIGS. 9 to 11.

Figure 9:
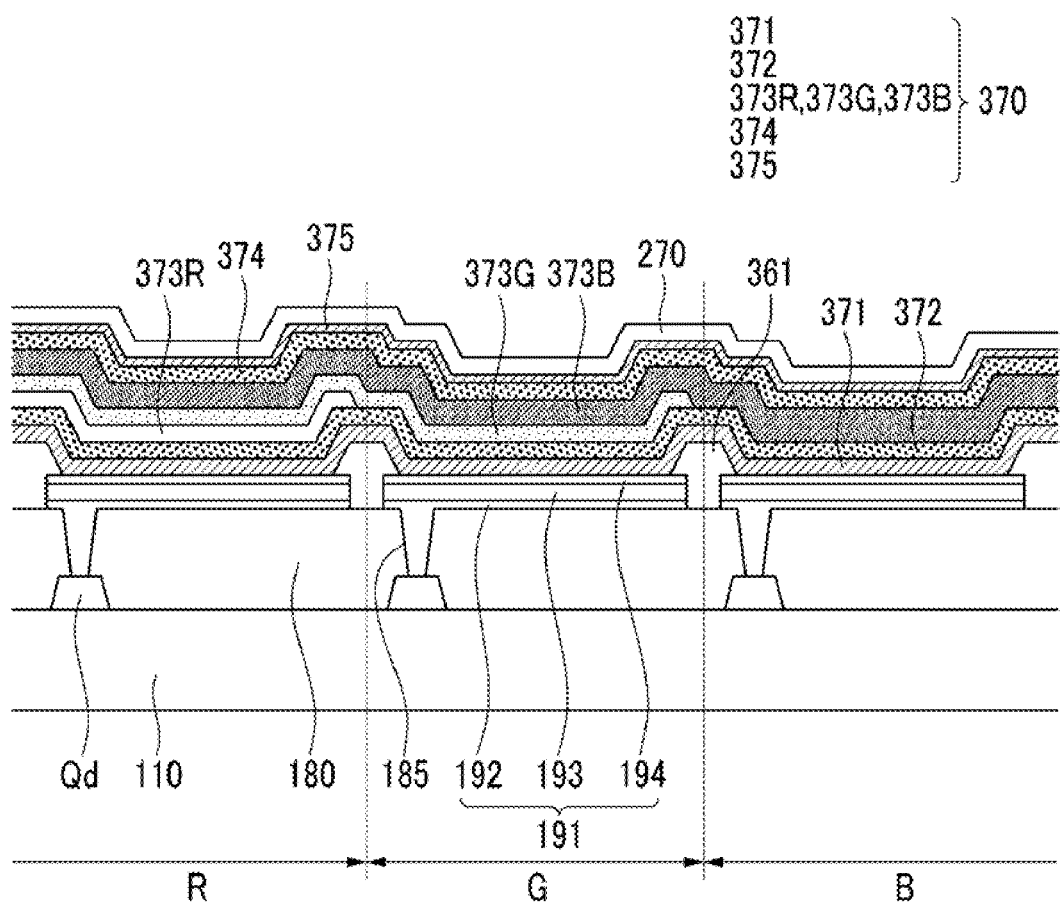
Figure 10:
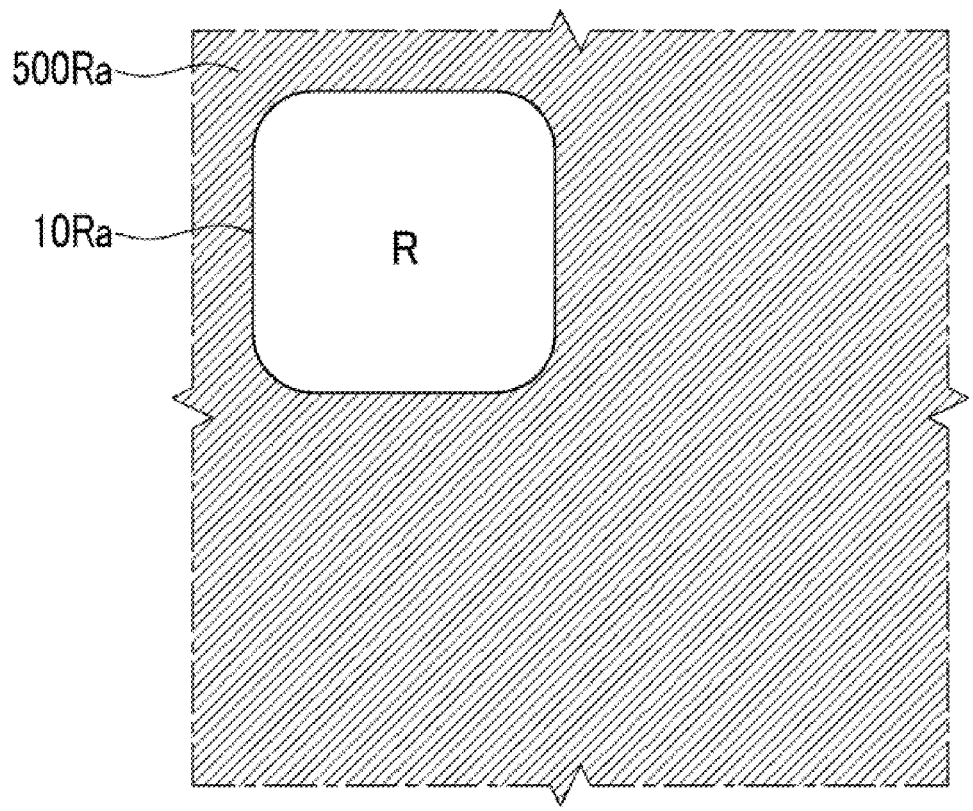
Figure 11:
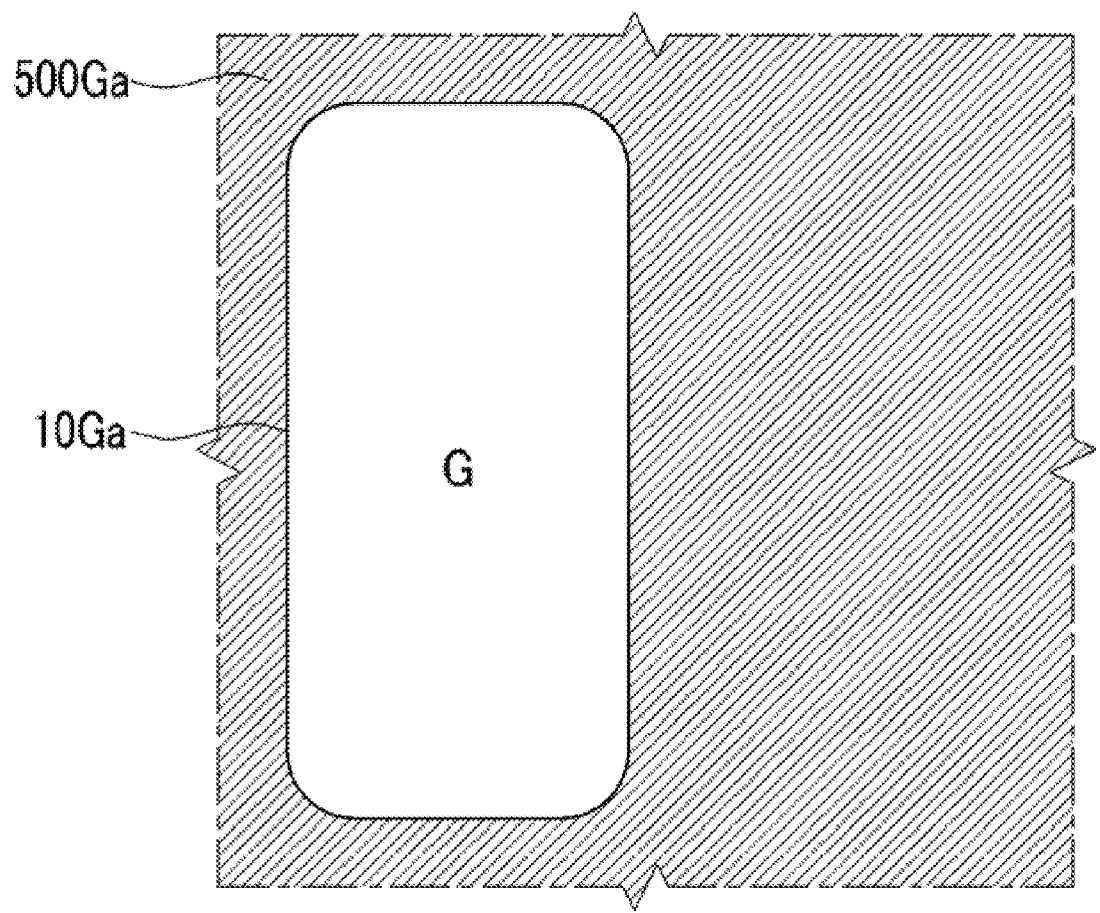

FIG. 9 is a cross-sectional view of three pixels of an organic light emitting device according to an exemplary embodiment of the present invention, and FIGS. 10 and 11 are views showing shadow masks used for forming red and green organic emission layers in a manufacturing method of an organic light emitting device having the pixel arrangement shown in FIGS. 1 and 9.

An organic light emitting device according to the present exemplary embodiment may be applied with the various characteristics related to the above described FIGS. 1 and 2. The same descriptions as for the previous exemplary embodiments are omitted, and the same constituent elements are indicated by the same reference numerals.

Firstly, referring to FIG. 9, the organic light emitting device according to the present exemplary embodiment is substantially the same as the organic light emitting device shown in FIG. 7, however the structure of the organic emission layers 373R, 373G, 373B are different. The red organic emission layer 373R is only formed in the red pixel R. The green organic emission layer 373G is formed in the red pixel R and the green pixel G. The blue organic emission layer 373B is formed in all pixels R, G, and B.

Each thickness of the red organic emission layer 373R, green organic emission layer 373G, and blue organic emission layer 373B may be in a range of 10 nm-50 nm. The total thickness of the red organic emission layer 373R, green organic emission layer 373G, and blue organic emission layer 373B deposited in the red pixel R may be in a range of 30 nm-150 nm. The total thickness of the green organic emission layer 373G and blue organic emission layer 373B deposited in the green pixel G may be in a range of 20 nm-100 nm.

In the red pixel R, the green and blue organic emission layers 373G, 373B are further formed on the red organic emission layer 373R such that a hole mobility of the host of the red organic emission layer 373R may be less than the hole mobility of the green organic emission layer 373G and blue organic emission layer 373B to prevent color mixture. The hole mobility of the red organic emission layer 373R may be less than $1\times10^{-4}$ cm$^2$/Vs (when the electric field is 1 MV/cm). The red organic emission layer 373R may be made of a hole transmitting material of a triphenylamine group such as NPB (N,N-di(naphthalene-1-yl)-N,N-diphenyl-benzidene) and TPB (tetraphenylbenzidine), a carbazole derivative such as CBP (4,4'-N,N'-dicarbazole-biphenyl), mCP (N,N-dicarbazolyl-3,5-benzene), and TcTa (4,4',4"-tri(N-carbazolyl)triphenylamine), or a metallic complex such as ZnPBO (phenyloxazole) and ZnPBT (phenylthiazole).

In the present exemplary embodiment, the optical path length in the red pixel R between the transflective electrode 193 and the common electrode 270 is determined by the thickness and the refractive index of the hole injection layer 371, the hole transport layer 372, the red organic emission layer 373R, the green organic emission layer 373G, the blue organic emission layer 373B, the electron transport layer 374, and the electron injection layer 375. The optical path length in the green pixel G between the transflective electrode 193 and the common electrode 270 is determined by the thickness and the refractive index of the hole injection layer 371, the hole transport layer 372, the green organic emission layer 373G, the blue organic emission layer 373B, the electron transport layer 374, and the electron injection layer 375. The optical path length in the blue pixel B between the transflective electrode 193 and the common electrode 270 is determined and by the thickness and the refractive index of the hole injection layer 371, the hole transport layer 372, the blue organic emission layer 373B, the electron transport layer 374, and the electron injection layer 375. Also, according to the present exemplary embodiment, a transparent supplementary member is not included in any pixels R, G, B, which is different from the exemplary embodiment shown in FIG. 7. This is because only by controlling the thickness of the red organic emission layer 373R, green organic emission layer 373G, and blue organic emission layer 373B, the optical path length for the microcavity process may be obtained.

In more detail, the thickness and the refractive indices of the several layers between the transflective electrode 193 and the common electrode 270 such as the blue organic emission layer 373B may be appropriately selected so that light of the wavelength corresponding to blue may be enhanced in the blue pixel B. The thickness and the refractive index of the green organic emission layer 373G may be selected by considering the thickness of the other layers so that light of the wavelength corresponding to green may be enhanced in the green pixel G, and the thickness and the refractive index of the red organic emission layer 373R may be selected by considering the thickness of the other layers so that light of the wavelength corresponding to red may be enhanced in the red pixel R.

A manufacturing method of the organic light emitting device shown in FIG. 9 is also substantially the same as the manufacturing method of the organic light emitting device according to the previous exemplary embodiment. However, in the present exemplary embodiment, the red organic emission layer 373R is deposited using a fourth shadow mask 500Ra shown in FIG. 10, and the green organic emission layer 373G is deposited using a fifth shadow mask 500Ga shown in FIG. 11.

The fourth shadow mask 500Ra includes an opening 10Ra that is substantially square at the position corresponding to the red pixel R of the organic light emitting device shown in FIG. 1, and may be the same as the first shadow mask 500R shown in FIG. 5. The fifth shadow mask 500Ga has an opening 10Ga with a substantially rectangular shape that is elongated up and down, that is, the shape in which the red pixel R and the green pixel G that are neighboring up and down are connected to each other in the organic light emitting device shown in FIG. 1, and may be the same as the third shadow mask 500RG shown in FIG. 8.

According to the present exemplary embodiment, the green organic emission layer 373G is also deposited in the red pixel R such that sufficient thickness may be obtained between the transflective electrode 193 and the common electrode 270. Therefore, it is not necessary to form a transparent supplementary member such as ITO or IZO, and only by controlling the thickness of the organic emission layer 373R, 373G, 373B, the optical path length for the microcavity process may be obtained. Also, the blue organic emission layer 373B is formed on the whole surface such that no shadow mask is necessary for it, and thus, the number of shadow masks used in the manufacturing process may be reduced and the manufacturing time and cost may be reduced.

In the various exemplary embodiments of the present invention, those skilled in the art would appreciate that the deposition sequence of the organic emission layer 373R, 373G, 373B may be changed. Also, in the organic light emitting device according to the various exemplary embodiments of the present invention, a red color filter of the red pixel R, a green color filter of the green pixel G, and a blue color filter of the blue pixel B may be further included for realizing clearer color.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
a first pixel that displays a first color;
a second pixel that displays a second color; and a third pixel that displays a third color,
wherein the first pixel, the second pixel and the third pixel together form one pixel group,
wherein each of the first pixel, the second pixel, and the third pixel comprises:
  a transflective pixel electrode reflects light as well as transmits light,
  an organic emission layer on the pixel electrode,
  a reflective common electrode on the organic emission layer so that light may escape through the transflective pixel electrode to form a bottom emitting device, and
  a transparent supplementary member between the pixel electrode and the common electrode for adjusting an optical path length between the pixel electrode and the common electrode in each of the first pixel, the second pixel and the third pixel,
wherein the organic emission layer of the first pixel comprises a first color emission layer for emitting light of the first color and a third color emission layer for emitting light of the third color, and does not include a second color emission layer for emitting light of the second color,
the organic emission layer of the second pixel comprises the second color emission layer and the third color emission layer, and does not include the first color emission layer, and
the organic emission layer of the third pixel comprises the third color emission layer, and does not include the first color emission layer and the second color emission layer.

2. An organic light emitting device comprising:
a first pixel that displays a first color;
a second pixel that displays a second color; and
a third pixel that displays a third color,
wherein the first pixel, second pixel and third pixel together form one pixel group,
wherein each of the first pixel, the second pixel, and the third pixel comprises:
  a transflective pixel electrode that reflects light as well as transmits light,
  an organic emission layer on the pixel electrode and
  a reflective common electrode on the third color organic emission layer so that light may escape through the transflective pixel electrode to form a bottom emitting device,
wherein:
  the first pixel further comprises a first transparent supplementary member disposed between the pixel electrode and the common electrode for adjusting an optical path length between the pixel electrode and the common electrode only in the first pixel,
  the organic emission layer of the first pixel comprises a first color organic emission layer and a third color organic emission layer disposed between the pixel electrode and the common electrode, and does not include a second color emission layer for emitting light of the second color,
  the organic emission layer of the second pixel comprises the second color organic emission layer and the third color organic emission layer disposed between the pixel electrode and the common electrode, and does not include the first color emission layer, and
  the third pixel does not include the first color organic emission layer and the second color organic emission layer.

3. The organic light emitting device of claim 2, wherein the transflective electrode is a metal comprising Ag or Al.

4. The organic light emitting device of claim 3, wherein the pixel electrode further comprises a conductive oxide member on or under the transflective electrode.

5. The organic light emitting device of claim 2, further comprising a second transparent supplementary member between the pixel electrode and the common electrode of the third pixel.

6. The organic light emitting device of claim 5, wherein the first transparent supplementary member and the second transparent supplementary member comprise ITO or IZO.

7. The organic light emitting device of claim 6, wherein:
the first transparent supplementary member contacts the pixel electrode of the first pixel, and
the second transparent supplementary member contacts the pixel electrode of the third pixel.

8. An organic light emitting device comprising:
a first pixel that displays a first color;
a second pixel that displays a second color; and
a third pixel that displays a third color,
wherein the first pixel, second pixel and third pixel together form one pixel group,
wherein each of the first pixel, the second pixel, and the third pixel comprises:
  a pixel electrode having a transflective electrode,
  an organic emission layer on the pixel electrode, and
  a common electrode on the organic emission layer, and
wherein the first pixel further comprises a first transparent supplementary member disposed between the pixel electrode and the common electrode, the organic emission layer of the first pixel comprising a first color organic emission layer and a third color organic emission layer disposed between the pixel electrode and the common electrode,
wherein the organic emission layer of the second pixel comprises a second color organic emission layer and the third color organic emission layer disposed between the pixel electrode and the common electrode, and
wherein the third pixel does not include the first color organic emission layer and the second color organic emission layer, and
wherein:
  the first pixel further comprises the second color organic emission layer, and
  the second pixel further comprises the first color organic emission layer.

9. The organic light emitting device of claim 8, wherein, in the one pixel group:
the first color organic emission layers of the first pixel and the second pixel are connected to each other and the second color organic emission layers of the first pixel and the second pixel are connected to each other, and
the first color organic emission layer and the second color organic emission layer overlap each other.

10. The organic light emitting device of claim 9, wherein the first color organic emission layer and the second color organic emission layer are under the third color organic emission layer.

11. The organic light emitting device of claim 10, wherein at least one of a hole mobility of the first color organic emission layer and a hole mobility of the second color organic emission layer is less than a hole mobility of the third color organic emission layer.

12. The organic light emitting device of claim 10, wherein at least one of a host of the first color organic emission layer and a host of the second color organic emission layer comprises at least one of a hole transmitting material comprising triphenylamine, a carbazole derivative, or a metallic complex.

13. The organic light emitting device of claim 10, wherein at least one of a host of the first color organic emission layer and a host of the second color organic emission layer comprises at least one of NPB (N,N-di(naphthalene-1-yl)-N,N-diphenyl-benzidene), TPB (tetraphenylbenzidine), CBP (4,4'-N,N'-dicarbazolebiphenyl), mCP (N,N-dicarbazolyl-3,5-benzene), TcTa (4,4',4''-tri(N-carbazolyl)triphenylamine), ZnPBO (phenyloxazole), or ZnPBT (phenylthiazole).

* * * * *